(12) United States Patent
Kim et al.

(10) Patent No.: US 11,442,522 B2
(45) Date of Patent: Sep. 13, 2022

(54) METHOD OF CONTROLLING PERFORMANCE BOOSTING OF SEMICONDUCTOR DEVICE BASED ON AT LEAST USER INPUT AND FEEDBACK FROM PREVIOUS BOOSTING POLICIES AND SEMICONDUCTOR DEVICE PERFORMING THE METHOD

(71) Applicant: Samsung Electronics Co., Ltd., Suwon-si (KR)

(72) Inventors: Sangkyu Kim, Suwon-si (KR); Jonglae Park, Anyang-si (KR); Hyunju Kang, Cheongdo-gun (KR); Jungwook Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 125 days.

(21) Appl. No.: 16/823,483

(22) Filed: Mar. 19, 2020

(65) Prior Publication Data

US 2021/0057420 A1  Feb. 25, 2021

(30) Foreign Application Priority Data

Aug. 21, 2019 (KR) .................... 10-2019-0102097

(51) Int. Cl.
*G06F 1/3203* (2019.01)
*H01L 27/112* (2006.01)
(Continued)

(52) U.S. Cl.
CPC .............. *G06F 1/3203* (2013.01); *G06F 1/12* (2013.01); *G06F 1/324* (2013.01); *G06F 1/3296* (2013.01); *H01L 27/112* (2013.01)

(58) Field of Classification Search
CPC ........ H01L 27/112; G06F 1/12; G06F 1/3203; G06F 1/324; G06F 1/3296; G06F 1/3262; G06F 1/3206; G06F 11/3409; Y02D 10/00

See application file for complete search history.

(56) References Cited

U.S. PATENT DOCUMENTS 7,730,340 B2  6/2010  Hu et al.
7,739,532 B2  6/2010  Grobman
(Continued)

FOREIGN PATENT DOCUMENTS

WO  WO-2016195225 A1  12/2016

*Primary Examiner* — Kim Huynh
*Assistant Examiner* — Cory A. Latham
(74) *Attorney, Agent, or Firm* — Harness, Dickey & Pierce, P.L.C.

(57) ABSTRACT

There is provided a method of controlling performance boosting of a semiconductor device. According to the method, input of a user is monitored. A performance of the semiconductor device is boosted by consecutively executing a plurality of boosting policies associated with a plurality of macros based on an input event associated with the input of the user and available energy during a boosting interval. Boosting level in each of the boosting policies may be adaptively determined based on the boosting level and the amount of usage of the semiconductor device used in the previous boosting policy and the boosting policies are consecutively executed. Accordingly, improved and/or optimal performance boosting can be provided to the semiconductor device and at the same time, a waste of power can be mitigated and/or prevented.

20 Claims, 15 Drawing Sheets

(51) Int. Cl.
*G06F 1/12* (2006.01)
*G06F 1/3296* (2019.01)
*G06F 1/324* (2019.01)

(56) References Cited

U.S. PATENT DOCUMENTS

| | | | | |
|---|---|---|---|---|
| 8,601,298 | B2* | 12/2013 | Salsbery | G06F 1/3203 |
| | | | | 713/320 |
| 9,244,747 | B2 | 1/2016 | Vanka et al. | |
| 9,904,612 | B2 | 2/2018 | Orakwue et al. | |
| 10,054,977 | B2 | 8/2018 | Mikhaylov et al. | |
| 10,539,995 | B2* | 1/2020 | Park | G06F 1/3234 |
| 2009/0037712 | A1* | 2/2009 | Mallik | G06F 1/3203 |
| | | | | 713/1 |
| 2012/0084583 | A1* | 4/2012 | Chen | G06F 1/3203 |
| | | | | 713/320 |
| 2012/0284543 | A1* | 11/2012 | Xian | G06F 1/3203 |
| | | | | 713/320 |
| 2014/0184619 | A1 | 7/2014 | Kim | |
| 2014/0325443 | A1* | 10/2014 | Kim | G06F 3/0488 |
| | | | | 715/825 |
| 2018/0181188 | A1* | 6/2018 | Park | G06F 11/302 |

\* cited by examiner

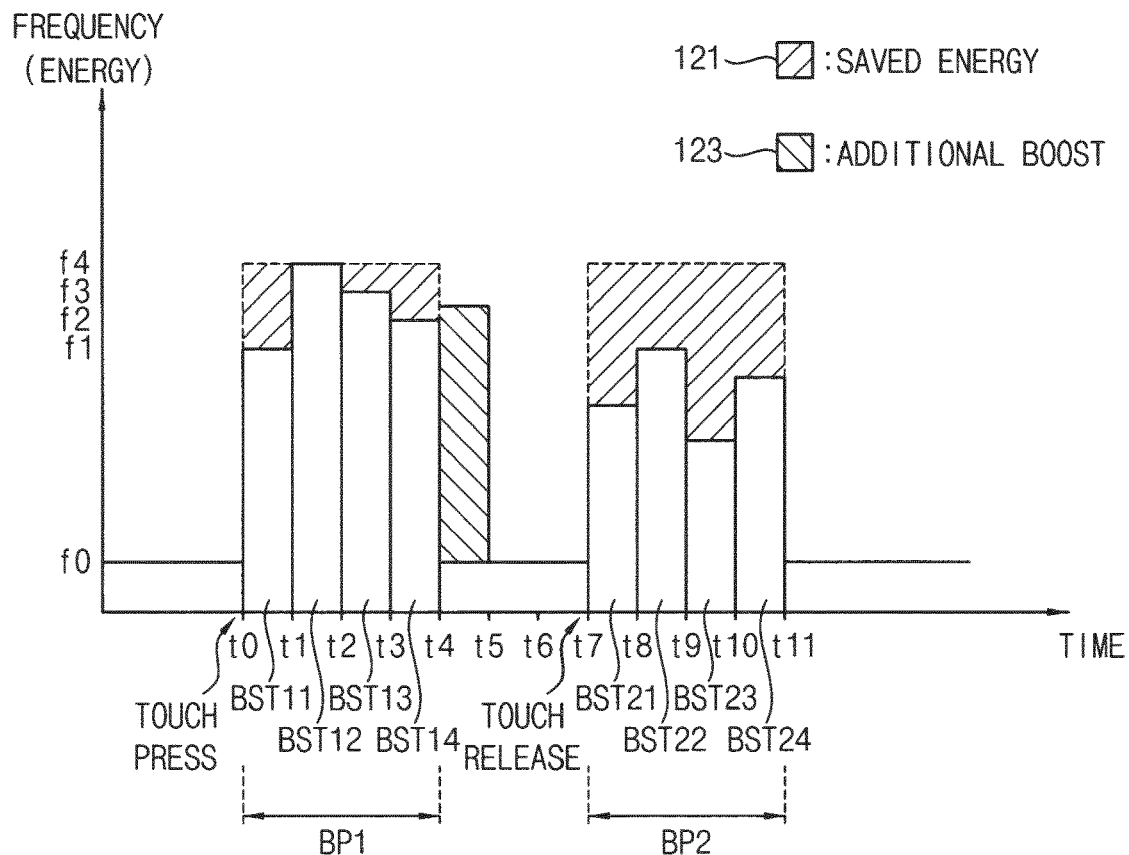

METHOD OF CONTROLLING PERFORMANCE BOOSTING OF SEMICONDUCTOR DEVICE BASED ON AT LEAST USER INPUT AND FEEDBACK FROM PREVIOUS BOOSTING POLICIES AND SEMICONDUCTOR DEVICE PERFORMING THE METHOD

CROSS-REFERENCE TO RELATED APPLICATION

This U.S. non-provisional application claims priority under 35 USC § 119 to Korean Patent Application No. 10-2019-0102097, filed on Aug. 21, 2019, in the Korean Intellectual Property Office (KIPO), the disclosure of which is incorporated by reference herein in its entirety.

BACKGROUND

1. Technical Field

Example embodiments relate generally to semiconductor devices. For example, at least some example embodiments relate to methods of controlling performance boosting of semiconductor device and/or semiconductor devices performing the same.

2. Discussion of the Related Art

Mobile devices, including smart phones, are generally powered by batteries. In order to increase the operating efficiency of mobile devices in an environment where only limited resources such as batteries are available, it is desired to appropriately manage the performance of mobile devices according to the circumstances.

Most mobile devices use a touch screen as their input means. More specifically, the touch screen of a mobile device receives a gesture operation from a user and provides the mobile device with location information indicating the location of the occurrence of the gesture operation and attribute information of the gesture operation.

In order to manage the performance of the mobile device, information input via the touch screen may be used to set a performance level of the mobile device. For example, the performance of the mobile device may be reduced than when there is no input to the touch screen and boosted in response to input from a user. However, power of a battery is consumed when the performance of the mobile device is boosted.

SUMMARY

Some example embodiments may provide a method of controlling performance boosting of a semiconductor device, which boosts performance efficiently while reducing energy consumption.

Some example embodiments may provide a semiconductor device, which boosts performance efficiently while reducing energy consumption.

According to example embodiments, there is provided a method of controlling boosting a performance of a semiconductor device including monitoring an input of a user; and boosting the performance of the semiconductor device for a boosting interval by consecutively executing a plurality of boosting policies associated with respective ones of a plurality of macros, based on the input of the user and an available energy during the boosting interval.

According to example embodiments, a semiconductor device includes a memory; and processing circuitry configured to control boosting a performance of the semiconductor device by, monitoring input of a user, and boosting the performance of the semiconductor device for a boosting interval by consecutively executing a plurality of boosting policies associated with respective ones of a plurality of macros, based on an input from the user and available energy during the boosting interval.

According to example embodiments, there is provided a method of controlling boosting a performance of a semiconductor device including monitoring an input of a user; monitoring an amount of usage of the semiconductor device; and boosting the performance of the semiconductor device for a boosting interval by sequentially executing a first boosting policy and a second boosting policy included in plurality of boosting policies associated with respective ones of a plurality of macros based on the input of the user, the amount of usage of the semiconductor device and available energy in the boosting interval such that, during execution of the second boosting policy, the boosting includes, obtaining a first feedback signal based on a result of performing the first boosting policy, the first feedback signal being associated with the amount of usage of the semiconductor device, and adaptively determining a second boosting level to be boosted in the second boosting policy based on a first boosting level boosted in the first boosting policy, a first feedback signal and a first consumed energy, the first consumed energy corresponding to energy consumed in the first boosting policy.

In the semiconductor device and a method of controlling performance boosting of a semiconductor device according to example embodiments, boosting level in each of the boosting policies may be adaptively determined based on the boosting level and/or the amount of usage of the semiconductor device used in the previous boosting policy and the boosting policies are consecutively executed. Accordingly, improved and/or optimal performance boosting can be provided to the semiconductor device and at the same time, a waste of power can be mitigated and/or prevented.

BRIEF DESCRIPTION OF THE DRAWINGS

Example embodiments of the present disclosure will be more clearly understood from the following detailed description taken in conjunction with the accompanying drawings.

FIG. 5 illustrates an example of the performance boosting associated with the semiconductor device according to example embodiments.

FIG. 6 illustrates an example of the macro list table in FIG. 1 according to example embodiments.

DETAILED DESCRIPTION

Figure 1:
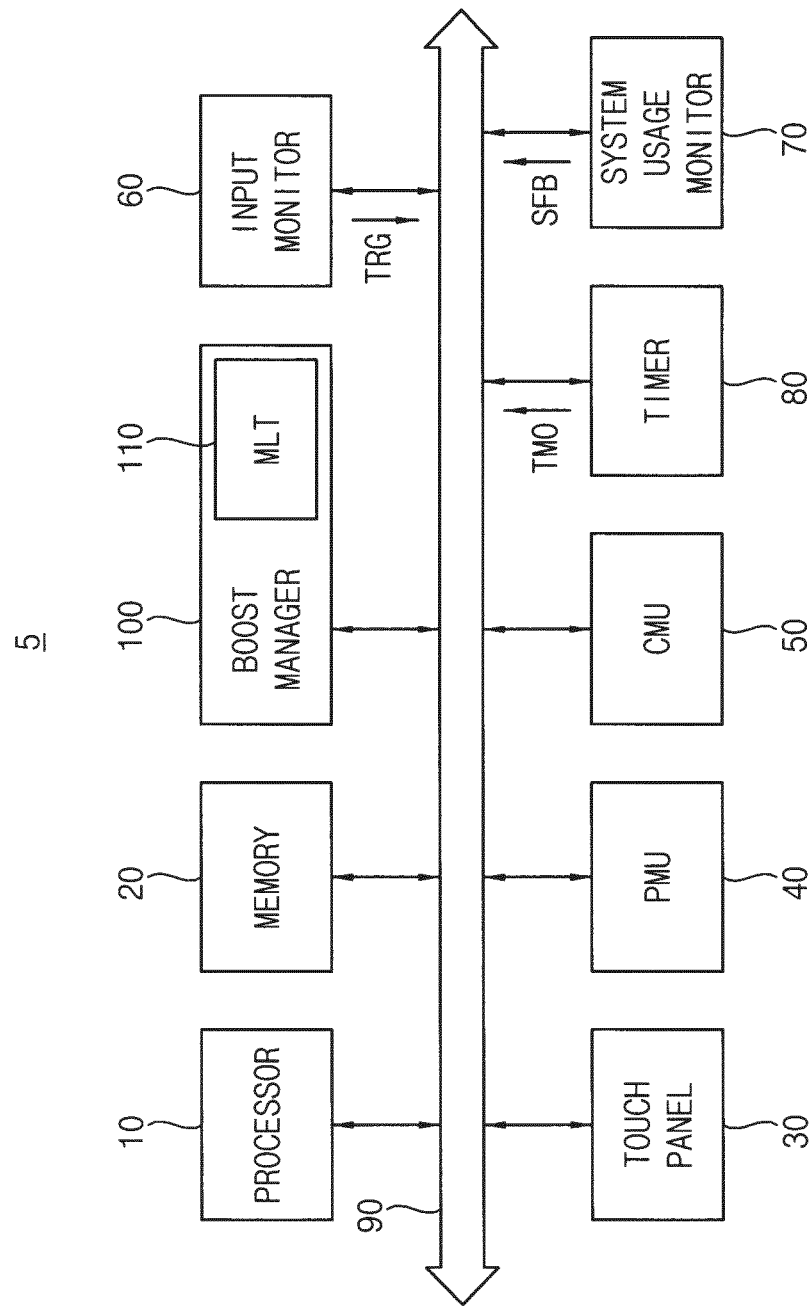
FIG. 1 is a block diagram illustrating a semiconductor device according to according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating a semiconductor device according to according to example embodiments.

Referring to FIG. 1, a semiconductor device 5 may include a processor 10, a memory 20, a touch panel 30, a power management unit (PMU) 40, and a clock management unit (CMU) 50, an input monitor 60, a system usage monitor 70, and a timer 80. The processor 10, the memory 20, the touch panel 30, the PMU 40, the CMU 50, the input monitor 60, the system usage monitor 70 and the timer 80 may be electrically connected by a bus 90 and may exchange signal and/or data with one another. The touch panel 30 may be also referred to as a 'touch screen'.

The semiconductor device 5 may further include a boost manager 100 which is implemented as an electric circuit.

A performance boosting technique of the semiconductor device 5 may be implemented as hardware, software, or both.

For example, in some example embodiments, the boost manager 100 may be implemented by the processor 10 executing performance boosting software loaded in the memory 20 that configures the processor 10 as a special purpose computer to perform the operations of the boost manager 100. In some other example embodiments, the boost manager 100 may be implemented as individual hardware.

The semiconductor device 5 may be, for example, a mobile device or a portable device such as a smart phone, a tablet computer, or a notebook computer, but the present disclosure is not limited thereto.

The processor 10 controls the other elements of the semiconductor device 5 and processes various computations for an operation of the semiconductor device. The processor 10 may include, for example, at least one of a central processing unit (CPU), a graphic processing unit (CPU), an application processor (AP), application specific integrated circuit (ASIC) and a communication processor (CP), but the present disclosure is not limited thereto.

The memory 20 stores performance boosting software and allows the processor 10 to execute the performance boosting software. The memory 20 may include a volatile memory such as a dynamic random access memory (DRAM) or a nonvolatile memory such as a flash memory.

The touch panel 30 receives a gesture operation from a user and provides the semiconductor device 5 with location information indicating the location of the occurrence of the gesture operation and attribute information of the gesture operation. The touch panel 30 may be implemented as a resistance film-type, capacitive-type, infrared-type, or ultrasonic-type touch screen, but the present disclosure is not limited thereto.

The PMU 40 manages the power of the semiconductor device 5. More specifically, the PMU 40 may control the boosting operation of the semiconductor device 5, or may operate the semiconductor device 5 in a low power mode or a sleep mode to lower the power consumption of the semiconductor device 5.

The CMU 50 manages a clock signal provided for the elements mounted in the semiconductor device 5. For example, the CMU 50 may generate a clock signal for operating elements such as the processor 10, may change the frequency of the clock signal depending on the circumstances of the semiconductor device 5, or may perform clock gating.

The input monitor 60 may monitor an input of a user and may provide the boost manager 100 and the timer 80 with a trigger signal TRG if an event associated with the input of the user occurs. The trigger signal TRG may indicate that the event associated with the input of the user occurs.

The system usage monitor 70 may monitor an amount of usage of the semiconductor device 5 and may provide the boost manager 100 with a feedback signal SFB indicating the amount of usage of the semiconductor device 5.

The timer 80 may calculate an elapse time from a time point when the trigger signal TRG is received, and may provide the boost manager 100 with a time-out signal TMO which is enabled when the calculated elapse time exceeds desired (or, alternatively, predetermined) available time. The available time may be associated with available application time of the boosting policies.

The boost manager 100 may terminate boosting the performance in response to receiving the time-out signal TMO.

The boost manager 100 may include a macro list table 110 that stores a plurality of macros and each of the plurality of macros describes contents associated with corresponding one of the boosting policies.

Figure 2:
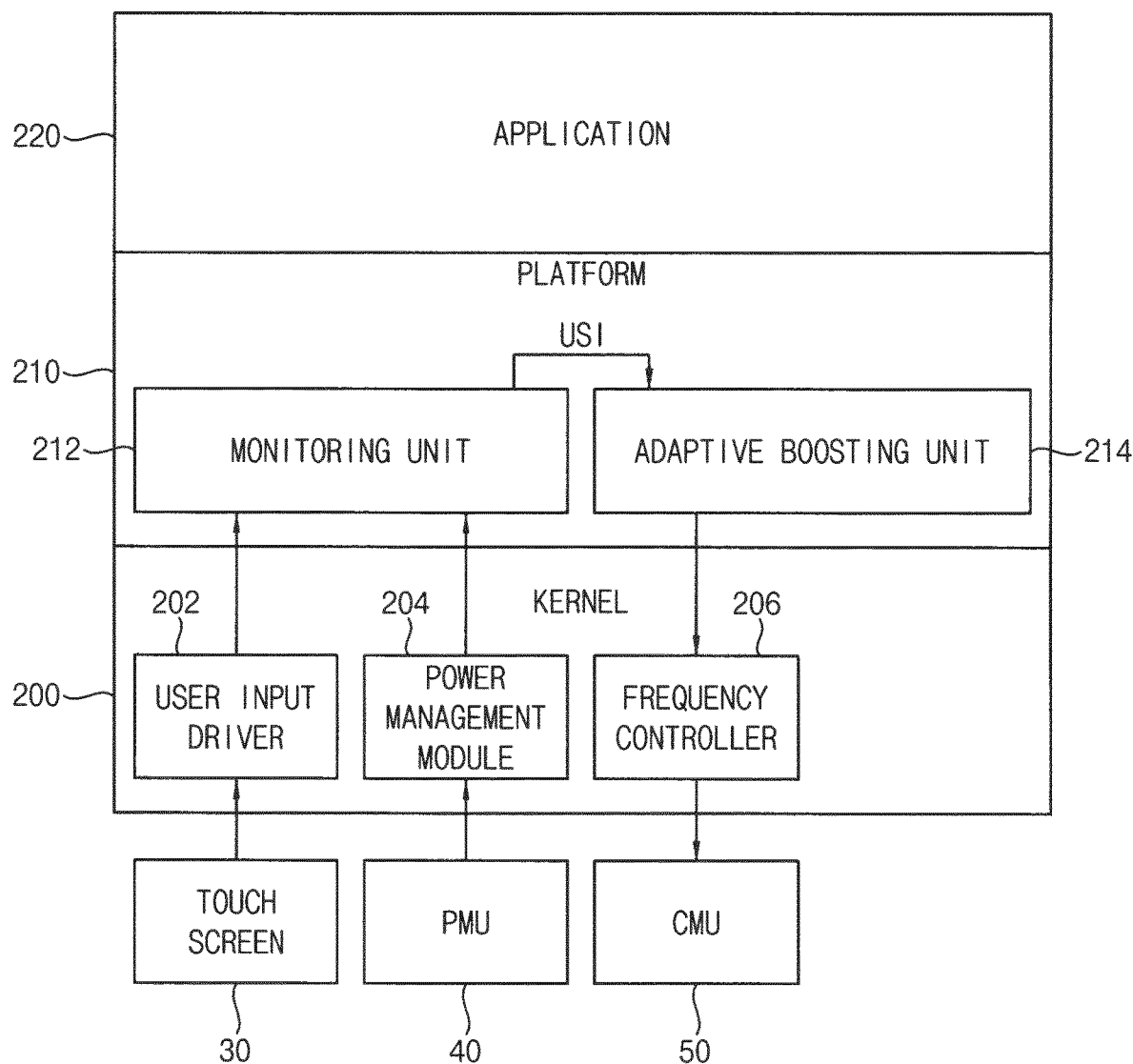
FIG. 2 is a block diagram for explaining performance boosting according to example embodiments.

FIG. 2 is a block diagram for explaining performance boosting according to example embodiments.

Referring to FIG. 2, the performance boosting may be implemented by the processor 10 executing software in the memory 20.

The memory 20 may be logically divided into areas where a kernel 200, a platform 210, and an application 220 are mounted.

The kernel 200 controls and manages system resources used to execute the platform 210 or the application 220. For example, the kernel 200 may control and manage system resources such as the touch panel 30, the PMU 40, and the CMU 50 via a user input driver 202, a power management module 204, and a frequency controller 206 that will be described later. In some example embodiments, the kernel 200 may be, for example, a Linux kernel, but the present disclosure is not limited thereto.

The platform 210 provides an operating environment in which the application 220 can be executed based on the kernel 200. For example, the platform 210 may provide various functions that the application 220 can use, by utilizing the user input driver 202, the power management module 204, and the frequency controller 206. In some example embodiments, the platform 210 may be, for example, an Apache platform, but the present disclosure is not limited thereto.

The application 220 may receive a request from the user, may process the request on the platform 210 using the system resources via the kernel 200, and may then provide the result of the processing to the user.

The performance boosting software is illustrated as being implemented in the platform 210, but the present disclosure is not limited thereto. That is, alternatively, the performance boosting software may be implemented at the level of the application 220 or the kernel 200.

The performance boosting software, which is implemented in the platform 210, includes a monitoring unit 212 and an adaptive boosting unit 214.

The monitoring unit 212 monitors the user's input and the amount of usage of the semiconductor device (system usage), and the adaptive boosting unit 214 performs adaptive performance boosting according to the user's input and the amount of system usage, determined by the monitoring unit 212. The monitoring unit 212 may perform a function of the input monitor 60 and a function of the system usage monitor 70.

More specifically, the monitoring unit 212 monitors the user's input received via, for example, the touch panel 30, and the amount of system usage provided by the PMU 40, and generates user system information USI based on the result of the monitoring upon the occurrence of a particular event. Examples of the particular event include a touch press event, a touch release event, and an application launch event.

The adaptive boosting unit 214 may boost an operating frequency of the processor 10 by consecutively executing the plurality of boosting policies based on the user system information USI and available energy during the boosting period by controlling the CMU 50 via, for example, a frequency controller 206, according to the plurality of boosting policies so as to adjust the frequency of a clock signal. The user system information USI may further include amount of system usage information.

The PMU 40 manages the power of the semiconductor device 5. More specifically, the PMU 40 may control the boosting operation of the semiconductor device 5, or may operate the semiconductor device 5 in a low power mode or a sleep mode to lower the power consumption of the semiconductor device 5.

The CMU 50 manages a clock signal provided for the elements mounted in the semiconductor device 5. For example, the CMU 50 may generate a clock signal for operating elements such as the processor 10, may change the frequency of the clock signal depending on the circumstances of the semiconductor device 5, or may perform clock gating.

Figure 3:
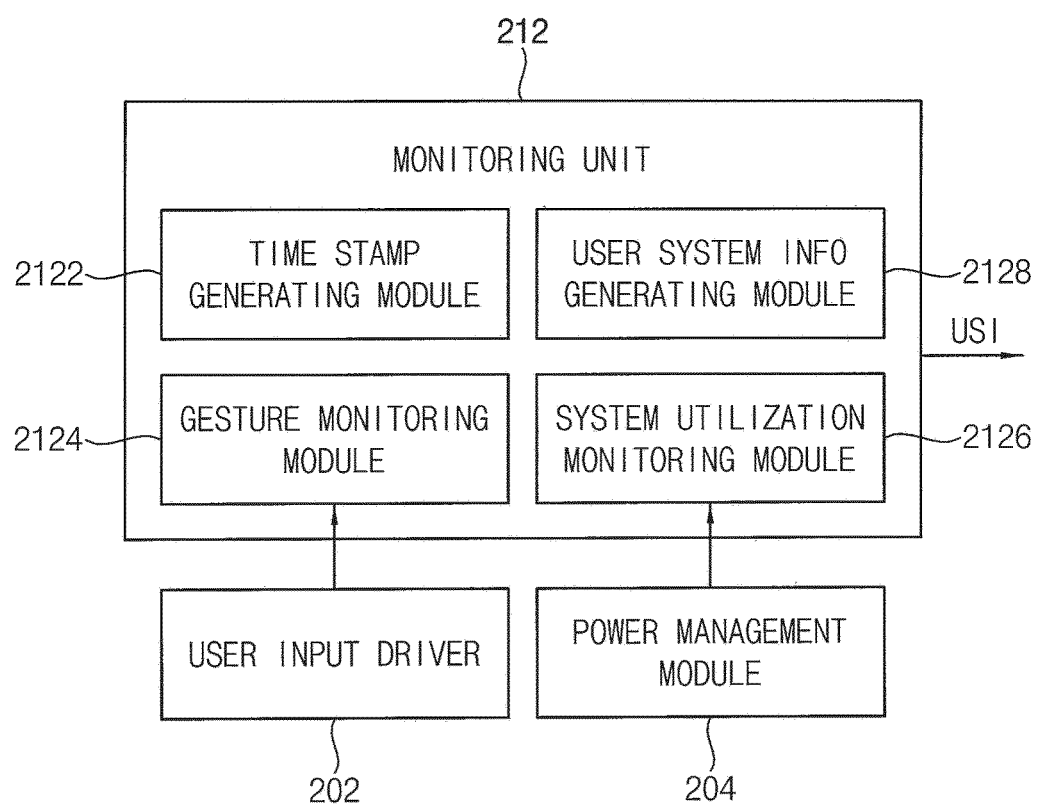
FIG. 3 is a block diagram of the monitoring unit of the performance boosting system according to the example embodiment of FIG. 2.

FIG. 3 is a block diagram of the monitoring unit of the performance boosting system according to the example embodiment of FIG. 2.

Referring to FIG. 3, the monitoring unit 212 includes a time stamp generating module 2122, a gesture monitoring module 2124, a system utilization monitoring module 2126, and a user system information generating module 2128.

The time stamp generating module 2122 generates time stamp information indicating the time of occurrence of an event. The time stamp information is included in the user system information USI and may be used for the adaptive boosting unit 214 to calculate the speed or acceleration of the user's input.

The gesture monitoring module 2124 monitors gesture input received via the touch screen 30. The gesture monitoring module 2124 may acquire, from the gesture input, coordinate information of the location of the occurrence of a gesture and press/release information indicating the attributes of the gesture.

The system utilization monitoring module 2126 monitors the amount of system usage provided via the PMU 40. For example, the system utilization monitoring module 2126 may receive the amount of system usage in the form of a percentage (%) in real time via the PMU 40. In some example embodiments, the amount of system usage may include a usage ration of the processor 10.

The user system information generating module 2128 generates the user system information USI including the coordinate information and the press/release information of the gesture, acquired by the gesture monitoring module 2124, and the amount of system usage provided to the system utilization monitoring module 2126 via the PMU 40. The user system information USI may further include the time stamp information generated by the time stamp generating module 2122. The monitoring unit 212 sends the user system information USI to the adaptive boosting unit 214.

Figure 4:
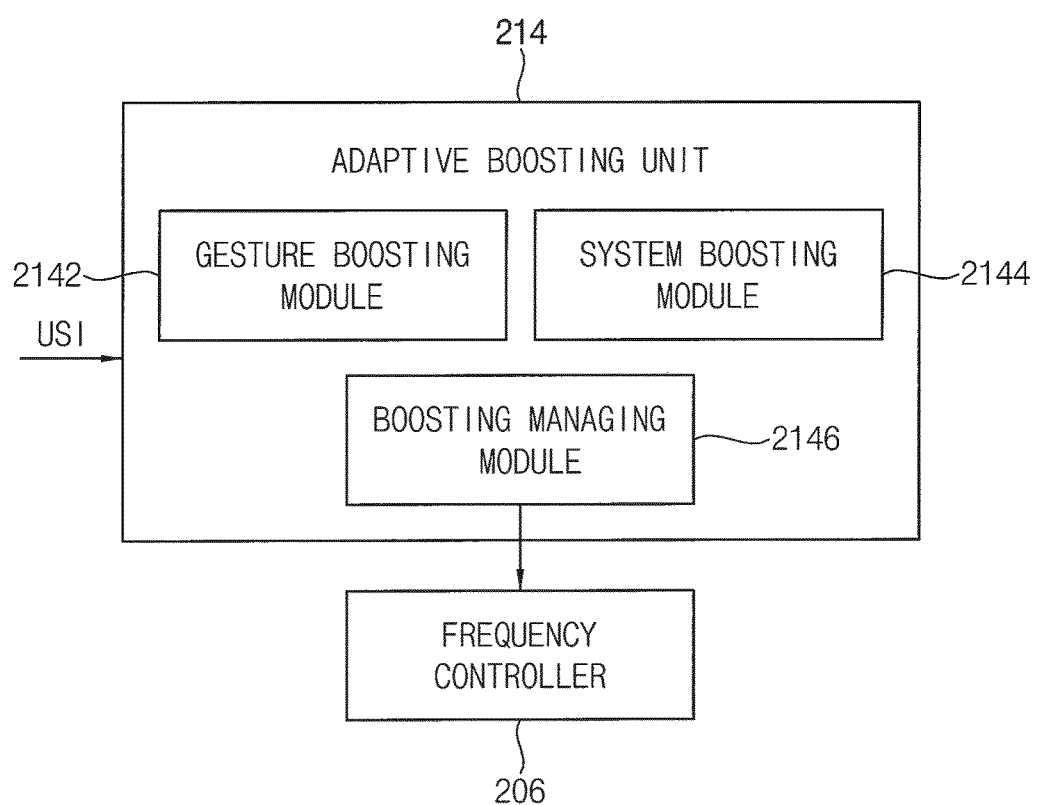
FIG. 4 is a block diagram of the adaptive boosting unit in FIG. 1 according to example embodiments.

FIG. 4 is a block diagram of the adaptive boosting unit in FIG. 1 according to example embodiments.

Referring to FIG. 4, the adaptive boosting unit 214 includes a gesture boosting module 2142, a system boosting module 2144, and a boosting managing module 2146. The adaptive boosting unit 214 receives the user system information USI from the monitoring unit 212.

The gesture boosting module 2142 calculates the speed or acceleration of the user's input or recognizes a press/release pattern using gesture information included in the user system information USI such as, for example, the coordinate information and the press/release information of the gesture.

The system boosting module 2144 calculates the amount or pattern of variation in the amount of system usage using the system usage amount information included in the user system information USI.

The boosting managing module 2146 controls the frequency of a clock signal by controlling, for example, the CMU 50, with the use of information calculated by the gesture boosting module 2142 and the system boosting module 2144, and thereby controls the frequency controller 206 to boost the operating frequency of the processor 10.

In some example embodiments, the boosting managing module 2146 may determine an operating frequency based on the speed (moving speed) of the user's input, calculated from the coordinate information of the gesture by the gesture boosting module 2142, and the amount of system usage provided by the system boosting module 2144.

For example, if the speed of the user's input increases, the boosting managing module 2146 may increase the operating frequency of the processor 10 because the increase of the speed of the user's input may mean the increase of the amount of workload that needs to be processed per unit time. For the same reason, the boosting managing module 2146 may lower the operating frequency of the processor 10 if the speed of the user's input decreases.

The boosting managing module 2146 may not increase the operating frequency of the processor 10 if the speed of the user's input is high but the amount of system usage is considerably small.

In other example embodiments, the boosting managing module 2146 may determine the length of a period for which to boost the operating frequency of the processor 10 based on the acceleration of the user's input, calculated from the coordinate information of the gesture by the gesture boosting module 2142, and a variation in the amount of system usage provided by the system boosting module 2144.

For example, if the acceleration of the user's input increases, the boosting managing module 2146 may increase the length of the period for which to boost the operating frequency of the processor 10 because the increase of the acceleration of the user's input may mean the increase of the amount of workload that needs to be processed per unit time after the occurrence of a touch release event. For the same reason, the boosting managing module 2146 may lower the operating frequency of the processor 10 if the acceleration of the user's input decreases. On the other hand, when the amount of system usage is large, the boosting managing module 2146 may determine that the circumstances of the performance boosting system are not uniform but variable, and may increase the operating frequency of the processor 10.

The performance boosting device including the monitoring unit 212 and the adaptive boosting unit 214 can perform adaptive performance boosting according to the pattern of the user's input and the amount of system usage. Accordingly, improved and/or optimal performance boosting can be provided to the semiconductor device 5, and at the same time, a waste of power can be mitigated and/or prevented.

FIG. 5 illustrates an example of the performance boosting associated with the semiconductor device according to example embodiments.

Referring to FIG. 5, a solid line represents an operating frequency boosted by the performance boosting according to example embodiments and a dot-and-dash line represents an operating frequency boosted by the conventional power management scheme.

In a case in which a touch press event occurs for the first time at a time t0, the frequency of a clock signal provided to, for example, the processor 10, is increased to an operating frequency f1 between times t0 and t1 because the amount of workload that needs to be processed per unit time is expected to increase. In addition, the frequency of the clock signal may be adjusted to operating frequencies f4, f3 and f2, respectively between times t1 and t2, t2 and t3, and t3 and t4 based on an operating frequency determined in the previous boosting policy and the amount of the system usage.

Each of intervals between times t0 and t4 denotes first through fourth sub boosting intervals BST11~BST14 and the first through fourth sub boosting intervals BST11~BST14 may be included in a first boosting interval BP1. Each of the second through fourth sub boosting intervals BST12~BST14 may obtain information on a boosting level of at least one of an operating frequency and an operating voltage in a corresponding boosting interval from each of the first through third sub boosting intervals BST11~BST13.

A predetermined and/or desired amount of time after the occurrence of the touch press event at the time t4, the amount of workload that needs to be processed per unit time slightly decreases. Thus, the frequency of the clock signal decreases from the operating frequency f1 to an operating frequency f0 and is then maintained at the operating frequency f0 until a time t6.

Thereafter, at the time t6 when a touch release event is expected to occur or at a time t7 when the touch release event actually occurs, the frequency of the clock signal may be increased again to an operating frequency greater than the operating frequency f0 because the amount of workload that needs to be processed per unit time is expected to rapidly increase again.

Each of intervals between times t7 and t11 denotes first through fourth sub boosting intervals BST21~BST24 and the first through fourth sub boosting intervals BST21~BST24 may be included in a second boosting interval BP2. Each of the second through fourth sub boosting intervals BST22~BST24 may obtain information on a boosting level of at least one of an operating frequency and an operating voltage in a corresponding boosting interval from each of the first through third sub boosting intervals BST21~BST23.

In FIG. 5, a reference numeral 121 represents an amount of energy saved by the performance boosting according to example embodiments compared with a boosting scheme in which a fixed frequency of a clock signal is used. A reference numeral 123 represents an amount of energy which is the same as the saved energy 121 and additional performance boost may be performed using the saved energy.

In this manner, performance boosting may be adaptively adjusted according to the amount of system usage and a boosting level determined previous boosting policy within the available energy. Accordingly, improved and/or optimal performance boosting can be provided to the semiconductor device 5, and at the same time, a waste of power can be mitigated and/or prevented.

FIG. 6 illustrates an example of the macro list table in FIG. 1 according to example embodiments.

Referring to FIG. 6, the macro list table 110 may store a plurality of macros MCR1, MCR2, . . . , MCRn which are associated with a plurality of boosting policies P1, P2, . . . Pn, respectively. The macro MCR1 may store an available energy EB during the boosting period and available execution time T1 of the boosting policy P1 as contents. The macro MCR2 may store the available energy EB during the boosting period and available execution time T2 of the boosting policy P2 as contents. The macro MCRn may store an available energy EB during the boosting period and available execution time Tn of the boosting policy Pn as contents.

Figure 7:
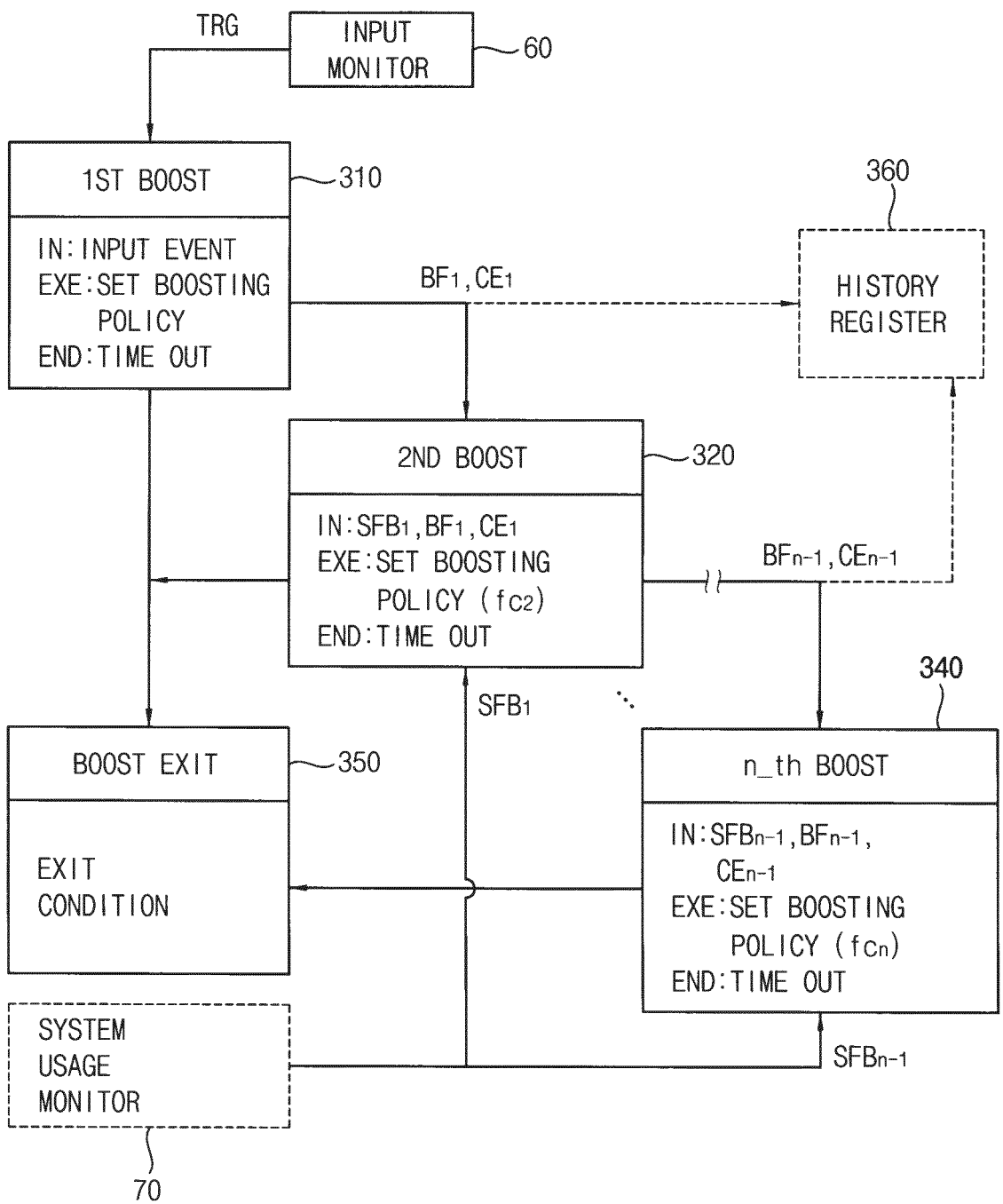
FIG. 7 is a diagram for explaining boosting operation according to example embodiments.

FIG. 7 is a diagram for explaining boosting operation according to example embodiments.

Referring to FIGS. 1 through 7, the boost manager 100 boosts the system according to the first boosting policy 310 in response to the trigger signal TRG, which is enabled when the input monitor 60 detects an event caused by the input of the user. The boost manager 100 receives an input event as input IN, executes a set (or, alternatively, a predetermined) boosting policy and may be terminated (ends) when the time-out signal is applied.

Information $BF_1$ about a first boosting level obtained as a result of executing the first boosting policy 310, a first consumed energy $CE_1$ consumed in the first boosting policy 310 and a first feedback signal $SFB_1$ may be considered in a second boosting policy 320. The first feedback signal $SFB_1$ may represent an amount of system usage based on result of executing the first boosting policy 310 and the first feedback signal SFB1 may be provided from the system usage monitor 70.

The second boosting policy 320 may be executed by a function $fc_2$ which receives as an input IN, the information $BF_1$ about the first boosting level, the first consumed energy $CE_1$, and the first feedback signal $SFB_1$.

Similarly, an n-th boosting policy 340 may receive as an input IN, information $BF_{n-1}$ about (n–1)-th boosting level, (n–1)-th consumed energy $Ce_{n-1}$, and (n–1)-th feedback signal $SFB_{n-1}$ and may include adaptively determining n-th boosting level based on the inputs. The n-th boosting policy 340 may be executed by a function $fc_n$ which receives as an input IN, the information $BF_{n-1}$ about the (n–1)-th boosting level, the (n–1)-th consumed energy $Ce_{n-1}$, and the (n–1)-th feedback signal $SFB_{n-1}$.

Information BF about the boosting level obtained by executing the boosting policies 310, 320 and 340, and the consumed energy CE may be stored in a history register 360 in the boost manager 100 or in the semiconductor device 5. Information BF about the boosting level the consumed energy CE which are associated with recently-executed boosting policy may be updated in the history register 360.

The boost manger 100 may terminate the performance boosting operation if a termination condition (exit condition) is satisfied. The termination condition may include a first condition, a second condition and a third condition. The boosting interval starts at a first time point and ends at a second time point. The first condition is satisfied if the available energy is consumed before the second time point. The second condition is satisfied if the number of the plurality of boosting policies becomes a threshold value. The third condition is satisfied if the available execution time expires. The boost manger 100 may terminate the performance boosting operation if at least one of the first through third condition is satisfied.

Figure 8:
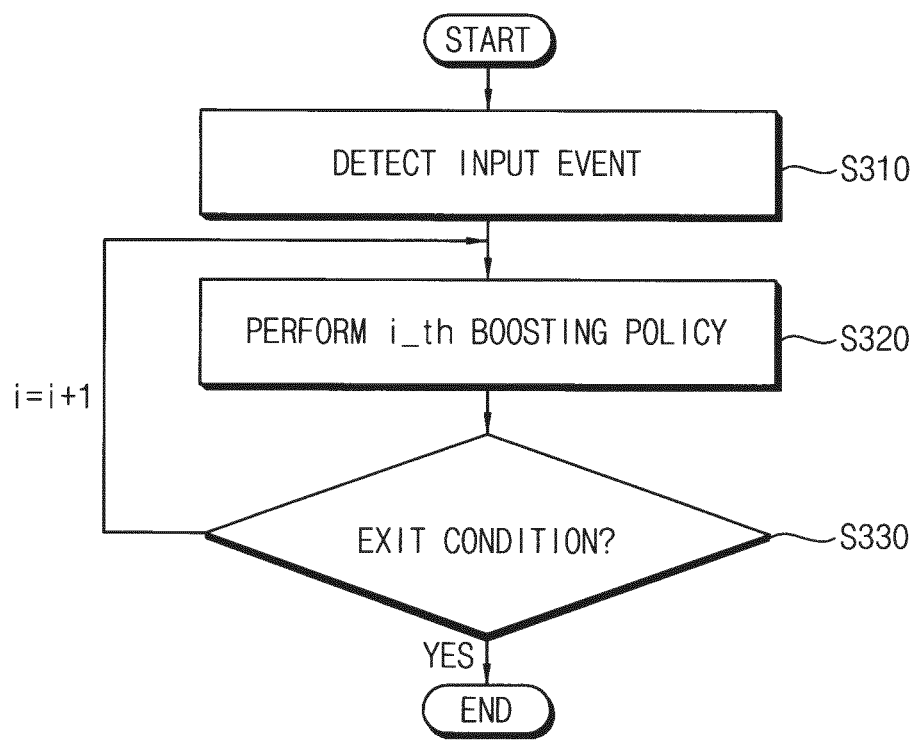
FIG. 8 is a flow chart for explaining boosting operation of FIG. 7 according to example embodiments.

FIG. 8 is a flow chart for explaining boosting operation of FIG. 7 according to example embodiments.

Referring to FIGS. 1 through 8, in response to execution of an i-th one of the boost policies, in operation S310, the boost manager 100 detects an input event, and, in operation S320, boosts the performance of the semiconductor device 5 based on the i-th boosting policy when the input event is detected. In operation S330, the boost manager 100 determines whether the termination condition (exit condition) is satisfied. If the exit condition is not satisfied (No in S330), the boost manager 100 increments i by one and boosts the performance of the semiconductor device 5 based on (i+1)-th boosting policy. Here, i corresponds to n discussed above with reference to FIG. 7.

The boosting operation of FIG. 8 may be represented as following expression 1 and the exit condition may be represented as following expression 2.

$$P_{i+1} = \min\{\text{Power}(P_k), \text{ where } P_k \in (Perf(P_i) + Perf(SFB_i) \geq R), i=1 \sim n\} \quad \text{[Expression 1]}$$

$$\Sigma \text{ Power } (P_i)^* T_i \leq EB \text{ or } \Sigma T_i \leq BO \text{ or } n < N \quad \text{[Expression 2]}$$

In Expressions 1 and 2, $P_i$ denotes i-th boosting policy, Ti denotes available execution time on the i-th boosting policy $P_i$, $SFB_i$ denotes i-th feedback signal used in the i-th boosting policy $P_i$, EB denotes available energy which may be consumed during the boosting interval in which the plurality of boosting policies are executed, BP denotes the boosting interval in which the plurality of boosting policies are executed, and R denotes system requirements such as power consumption and required performance. Then boosting interval BP may start at a first time point and end at a second time point.

If the i-th boosting policy $P_i$ is associated with a frequency, Power $(P_i) = f_{Pi} * V_i^2$ ($V_i$ denotes a voltage at $P_i$) + static power, and may have a desired (or, alternatively, a predetermined) value when $P_i$ is variable.

In addition, Perf($P_i$) denotes a performance boosted by the i-th boosting policy $P_i$, and Perf($SFB_i$) denotes a performance boosted by the i-th feedback signal $SFB_i$. In addition, Perf($SFB_i$) is a value that is feedback for compensating for Perf($P_i$). Perf($SFB_i$) may correspond to one of negative value, zero and positive value.

Therefore, Expression 1 describes that a boosting policy consuming minimum energy of one or more boosting policies that satisfy Perf($P_i$)+Perf($SFB_i$) equal to or greater than the system requirements R is determined as the (i+1)-th boosting policy. Here, k is an integer greater than zero.

In addition, according to Expression 2, the termination condition may include the first through third conditions. The first condition is satisfied if accumulated consumed energy Power $(P_i)^* T_i$ exceeds the available energy EB. The second condition is satisfied if the number n of the plurality of boosting policies becomes a threshold value N. The third condition is satisfied if the available execution time BP expires. The boost manger 100 may terminate the performance boosting operation if at least one of the first through third condition is satisfied.

Figure 9:
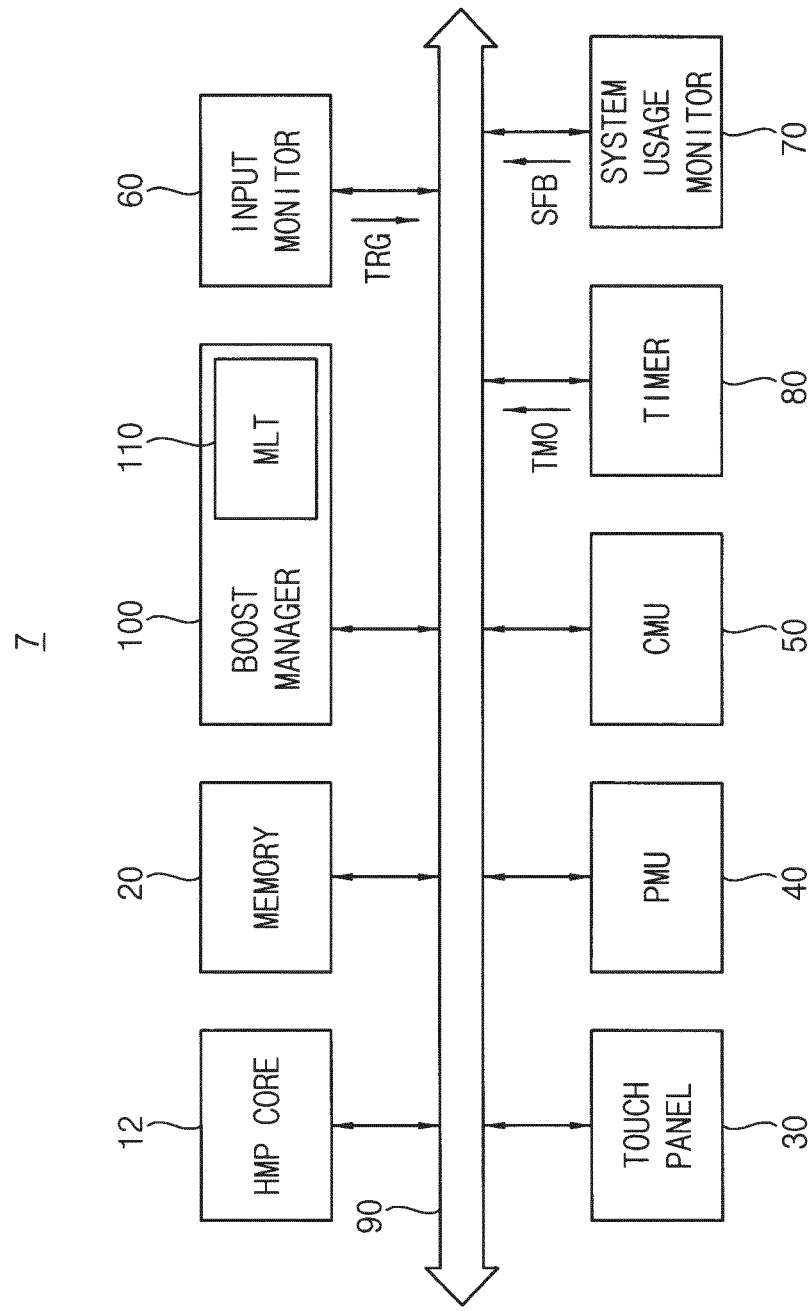
FIG. 9 is a block diagram illustrating a semiconductor device according to according to other example embodiments.

FIG. 9 is a block diagram illustrating a semiconductor device according to according to other example embodiments.

A semiconductor device 7 of FIG. 9 differs from the semiconductor device 5 of FIG. 1 in that the semiconductor device 7 includes heterogeneous multi-processing (HMP) cores 12 instead of the processor 10.

The semiconductor device 7 may include the HMP core 12, the memory 20, the touch screen 30, the PMU 40, the CMU 50, the input monitor 60, the system usage monitor 70 and the timer 80. The HMP core 12, the memory 20, the touch screen 30, the PMU 40, the CMU 50, the input monitor 60, the system usage monitor 70 and the timer 80 may be electrically connected by a bus 90 and may exchange signal and/or data with one another.

The semiconductor device 7 may further include the boost manger 100 which is implemented as an electric circuit.

A performance boosting technique of the semiconductor device 7 may be implemented as hardware. In this case, the boost manager 100 may be implemented by the HMP core 12 executing performance boosting software loaded in the memory 20. The HMP core 12 includes a plurality of big cores and a plurality of little cores and the HMP core 12 may set a HMP boost that selectively enables the plurality of big cores among the plurality of big cores and the plurality of little cores, based on the amount of usage of the semiconductor device 7.

Figure 10:
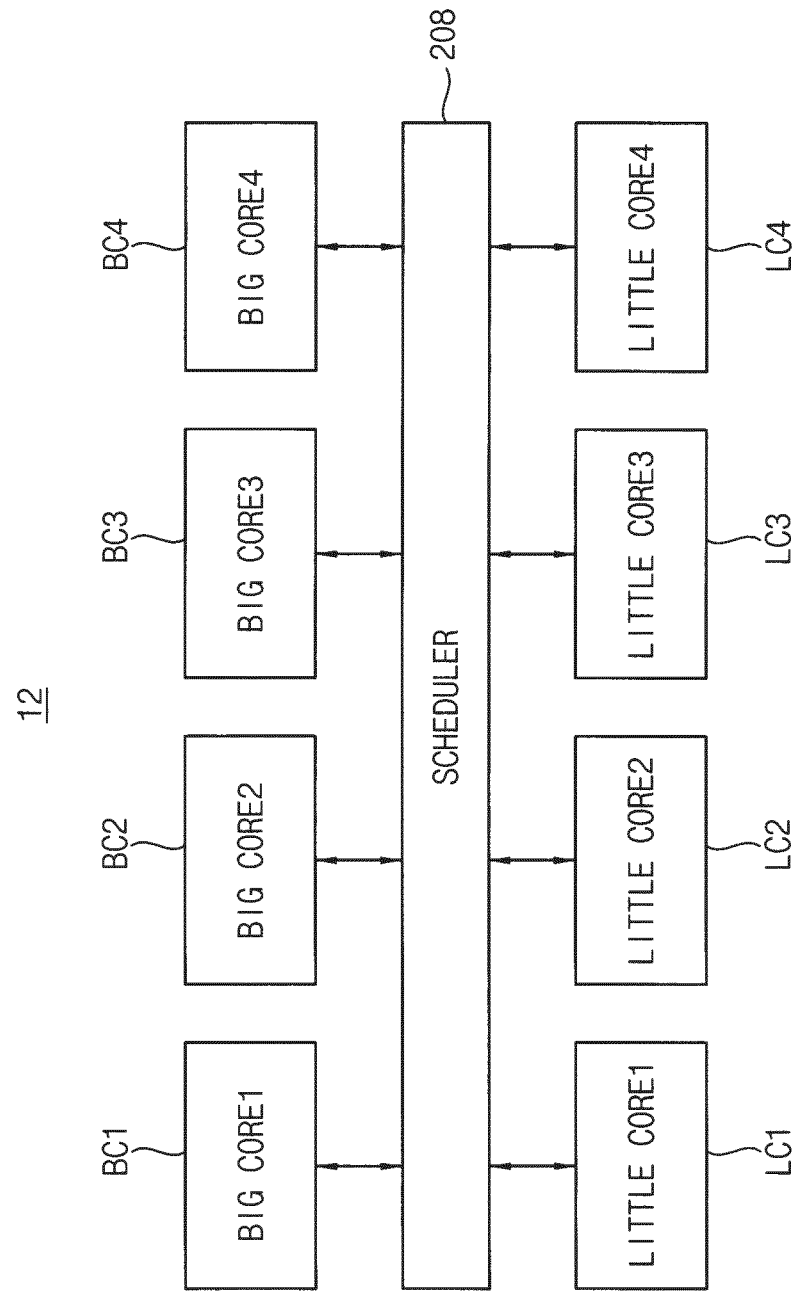
FIG. 10 is a block diagram of the HMP core in the semiconductor device of FIG. 9 according to example embodiments.

FIG. 10 is a block diagram of the HMP core in the semiconductor device of FIG. 9 according to example embodiments.

Referring to FIG. 10, the HMP core 12 may include a plurality of big cores BC1 through BC4, and a plurality of little cores LC1 through LC4. In some example embodiments, the HMP core 12 may be a big.LITTLE™ architecture developed by ARM Holdings, but the present disclosure is not limited thereto.

The big cores BC1 to BC4 are high-performance cores with relatively high power consumption, and the little cores LC1 to LC4 are low-performance cores with relatively low power consumption.

In general, since only one of these two types of cores is activated at once but all the cores use the same memory area, workloads can be allocated between the big cores BC1 to BC4 and the little cores LC1 to LC4 in order to allocate cores dynamically according to the amount of computation in a multi-core environment and thus to achieve a higher level of power consumption with clock control alone.

A scheduler 208 may perform global task scheduling to support HMP. The scheduler 208 may generally be implemented at the level of the kernel 200, but the present disclosure is not limited thereto.

Figure 11:
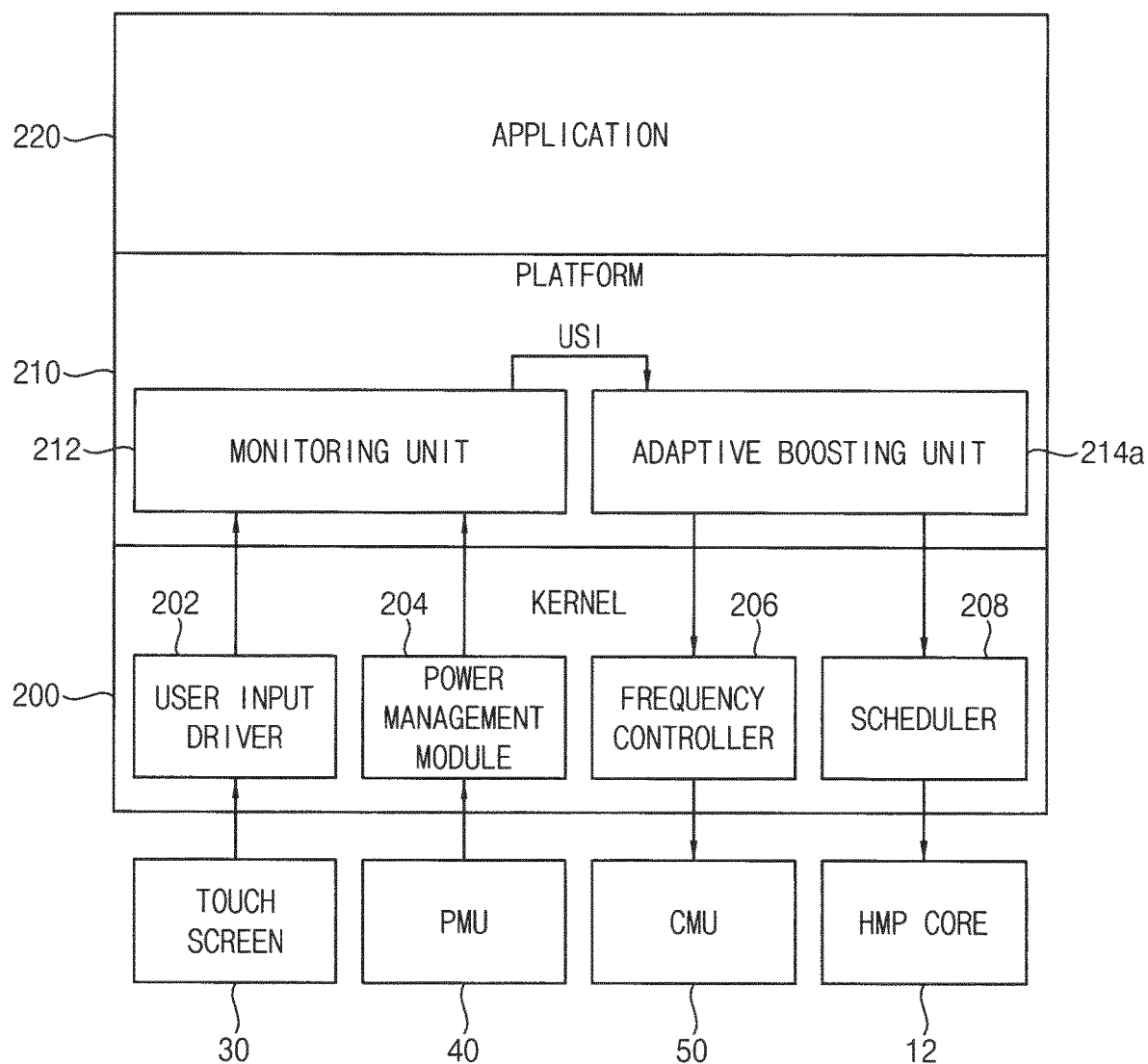
FIG. 11 is a block diagram for explaining performance boosting according to example embodiments.

FIG. 11 is a block diagram for explaining performance boosting according to example embodiments.

Referring to FIG. 11, the monitoring unit 212 monitors the user's input and the amount of usage of the semiconductor device (system usage), and an adaptive boosting unit 214a performs adaptive performance boosting according to the user's input and the amount of system usage, determined by the monitoring unit 212.

More specifically, the monitoring unit 212 monitors the user's input received via, for example, the touch screen 30, and the amount of system usage provided by the PMU 40, and generates the user system information USI based on the result of the monitoring upon the occurrence of a particular event.

Examples of the particular event include a touch press event, a touch release event, and an application launch event.

The adaptive boosting unit 214a may boost an operating frequency of the HMP core 12 by consecutively executing the plurality of boosting policies based on the user system information USI and available energy during the boosting period and by controlling the CMU 50 via, for example, a frequency controller 206, according to the plurality of boosting policies so as to adjust the frequency of a clock signal. The user system information USI may further include amount of system usage information.

The adaptive boosting unit 214a may set the HMP boost additional by controlling the scheduler 208 when boosting the operating frequency. The adaptive boosting unit 214a may active the bi cores BC1~BC4 in the HMP core 12 during in interval in which the amount of workload that needs to be processed per unit time is expected to increase.

Figure 12:
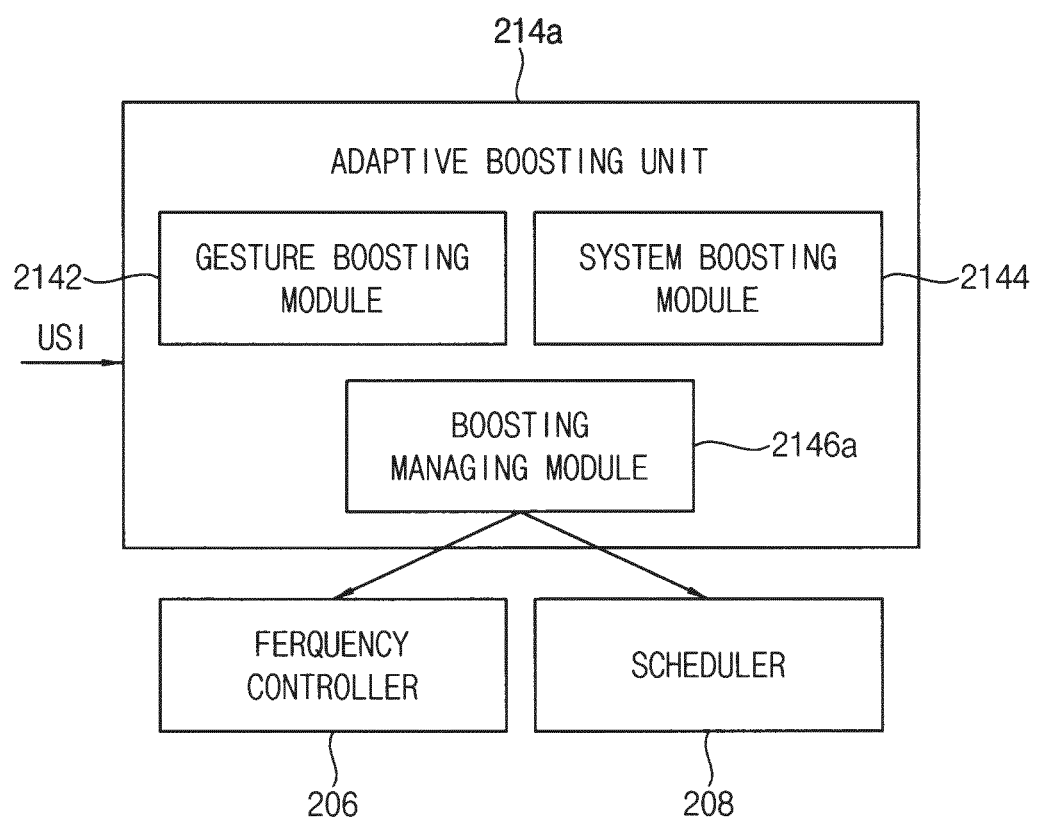
FIG. 12 is a block diagram of the adaptive boosting unit in FIG. 11 according to example embodiments.

FIG. 12 is a block diagram of the adaptive boosting unit in FIG. 12 according to example embodiments.

Referring to FIG. 12, the adaptive boosting unit 214a includes a gesture boosting module 2142, a system boosting module 2144, and a boosting managing module 2146a. The adaptive boosting unit 214a receives the user system information USI from the monitoring unit 212.

The boosting managing module 2146a controls the frequency of a clock signal by controlling, for example, the CMU 50, with the use of information calculated by the gesture boosting module 2142 and the system boosting module 2144, and thereby controls the frequency controller 206 to boost the operating frequency of the processor 10. In addition, the boosting managing module 2146a may set the HMP boost additional by controlling the scheduler 208.

In some example embodiments, the boosting managing module 2146a may determine an operating frequency based on the speed (moving speed) of the user's input, calculated from the coordinate information of the gesture by the gesture boosting module 2142, and the amount of system usage provided by the system boosting module 2144.

In some example embodiments, the boosting managing module 2146a may set the HMP boost based on the acceleration of the user's input, calculated from the coordinate information of the gesture by the gesture boosting module 2142, and a variation in the amount of system usage provided by the system boosting module 2144.

For example, if the acceleration of the user's input increases, the boosting managing module 2146a may activate the big cores BC1~BC4 in the HMP core 12 because the increase of the acceleration of the user's input may mean the increase of the amount of workload that needs to be processed per unit time after the occurrence of a touch release event.

For the same reason, the boosting managing module 2146a may activate the little core LC1~LC4 if the acceleration of the user's input decreases. On the other hand, when the amount of system usage is large, the boosting managing module 2146a may activate the big cores BC1~BC4 in the HMP core 12.

As described above, the performance boosting device including the monitoring unit 212 and the adaptive boosting unit 214a can perform adaptive performance boosting according to the pattern of the user's input and the amount of system usage. Accordingly, improved and/or optimal performance boosting can be provided to the semiconductor device 7, and at the same time, a waste of power can be mitigated and/or prevented.

Figure 13:
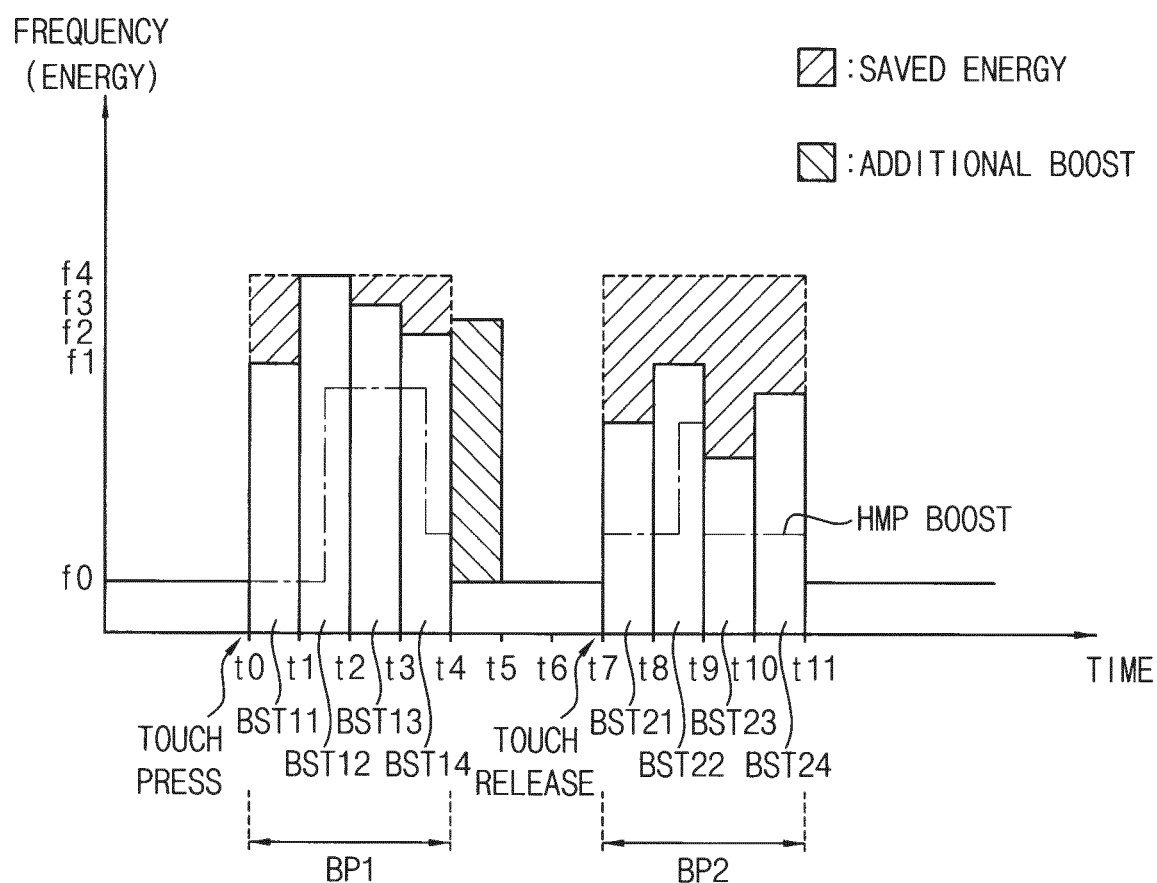
FIG. 13 illustrates an example of the performance boosting associated with the semiconductor device according to example embodiments.

FIG. 13 illustrates an example of the performance boosting associated with the semiconductor device according to example embodiments.

Referring to FIG. 13, a solid line represents an operating frequency boosted by the performance boosting according to example embodiments, a dot-and-dash line represents an operating frequency boosted by the conventional power management scheme and alternate long and short dash line represents the HMP boost.

In a case in which a touch press event occurs for the first time at a time t0, the frequency of a clock signal provided to, for example, the HMP core 12, is increased to an operating frequency f1 between times t0 and t1 because the amount of workload that needs to be processed per unit time is expected to increase. In addition, the frequency of the clock signal may be adjusted to operating frequencies f4, f3 and f2, respectively between times t1 and t2, t2 and t3, and t3 and t4 based on an operating frequency determined in the previous boosting policy and the amount of the system usage. In addition, the HMP boost is set between the times t1~t4 and the big cores BC1~BC4 in the HMP core 12 are activated.

A predetermined and/or desired amount of time after the occurrence of the touch press event at the time t4, the amount of workload that needs to be processed per unit time slightly decreases. Thus, the frequency of the clock signal decreases from the operating frequency f1 to an operating frequency f0 and is then maintained at the operating frequency f0 until a time t6. In addition, the HMP boost is set between times t8~t9 and the big cores BC1~BC4 in the HMP core 12 are activated.

As described with reference to FIG. 5, each of intervals between times t0 and t4 denotes first through fourth sub boosting intervals BST11~BST14 and the first through fourth sub boosting intervals BST11~BST14 may be included in a first boosting interval BP1. Each of the second through fourth sub boosting intervals BST12~BST14 may obtain information on a boosting level of at least one of an operating frequency and an operating voltage in a corresponding boosting interval from each of the first through third sub boosting intervals BST11~BST13.

In addition, each of intervals between times t7 and t11 denotes first through fourth sub boosting intervals BST21~BST24 and the first through fourth sub boosting intervals BST21~BST24 may be included in a second boosting interval BP2. Each of the second through fourth sub boosting intervals BST22~BST24 may obtain information on a boosting level of at least one of an operating frequency and an operating voltage in a corresponding boosting interval from each of the first through third sub boosting intervals BST21~BST23.

Figure 14:
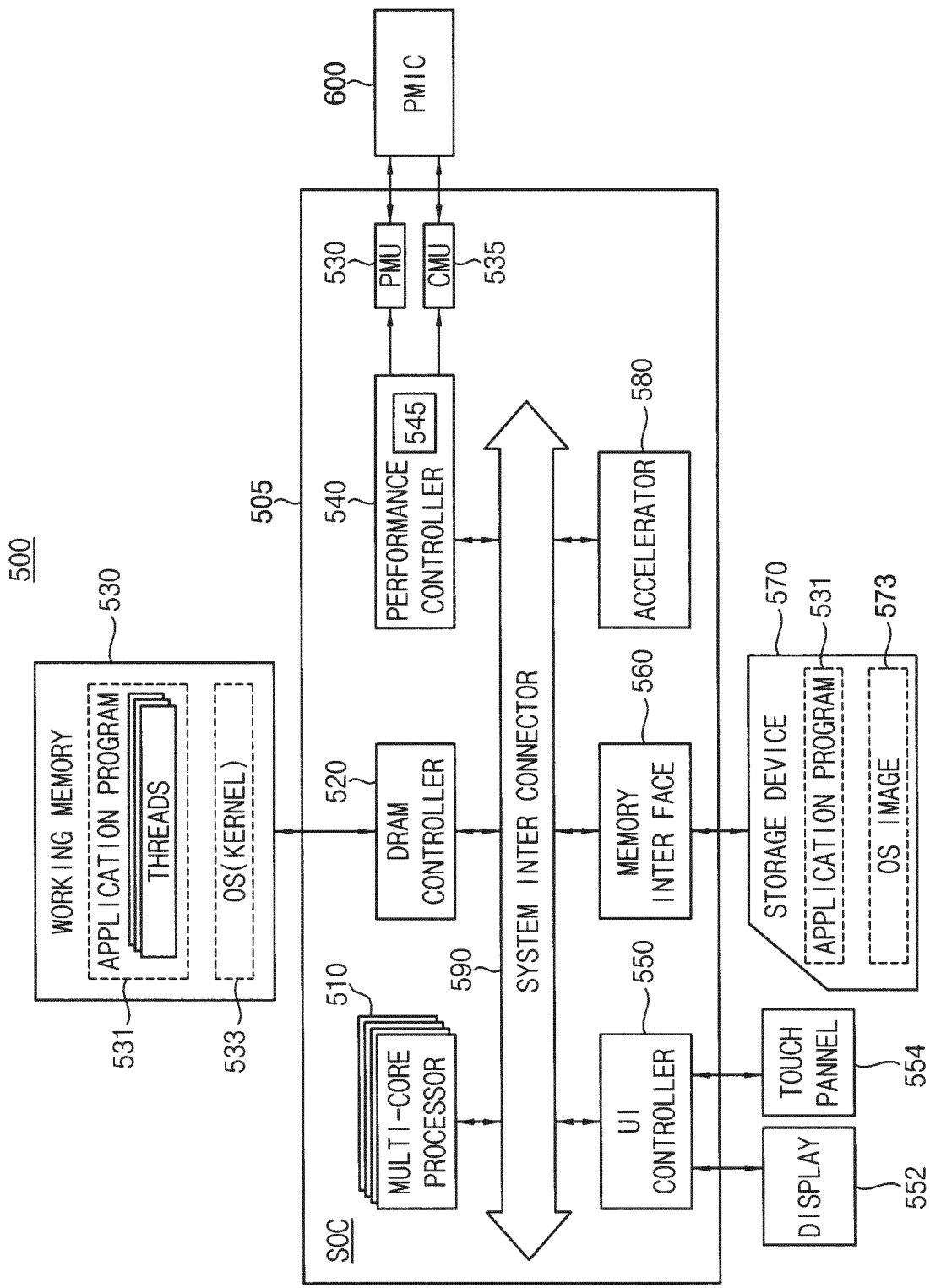
FIG. 14 is a block diagram of a mobile device according to example embodiments.

FIG. 14 is a block diagram of a mobile device according to example embodiments.

Referring to FIG. 14, a mobile device 500 may include a system-on-chip (SoC) 505 and operation or working memory 530, a display 552, a touch panel 554, a storage device 570 and a power management integrated circuit (PMIC) 600.

The SoC 505 may include a multi-core processor 510, a memory controller 520, a performance controller 540, a PMU 530, a CMU 535, a user interface (UI) controller 550, a memory interface 560, and an accelerator 580.

The multi-core processor 510 executes software (application program, operating system (OS), and device drivers) to be executed in the mobile device 500. The multi-core processor 510 may execute various application programs to be driven based on the operating system (OS). The multi-core processor 510 may be provided as a homogeneous multi-core processor or a heterogeneous multi-core processor.

Each of the multi-cores of the multi-core processor 510 includes a plurality of power domains operated by an independent driving clock and an independent driving voltage. A driving voltage and a driving clock provided to each of the multi-cores may be cut off or connected in units of cores.

In each of the multi-cores, a frequency of a driving clock and a level of a driving voltage may vary depending on a processing load of each core. That is, each core may be controlled in a dynamic voltage frequency scaling (hereinafter referred to as "DVFS") manner in which a frequency of a driving clock or a level of a driving voltage increases depending on a size of a load.

In particular, when a single thread is scheduled to the multi-core processor 510, it is detected whether the scheduled thread has the same context as a thread executed in a high-performance core. A thread determined to share a context with the thread executed in the high-performance core may be subjected to thread migration to be executed in the high-performance core. This scheduling may be performed at a kernel of the operating system (OS).

The memory controller 520 provides interfacing between the working memory 530 and the SoC 505. The memory controller 520 may access the working memory 530 according to a request of the multi-core processor 510 or another intellectual property (IP).

For example, the memory controller 520 may write data into the working memory 530 according to a write request of the multi-core processor 510. Alternatively, the memory controller 520 may read data from the working memory 530 according to a read request and transmit the read data to the multi-core processor 510 or the memory interface 560 via a data bus.

The operating system (OS) 533 or application programs may be loaded to the working memory 530 during a booting operation. For example, an OS image stored in the storage device 570 is loaded to the working memory 530 according to a booting sequence during a booting operation of the mobile device 500. The overall input/output operations of the mobile device 500 may be supported by the operating system (OS) 533. Similarly, application programs may be loaded to the working memory 530 to be selected by a user or to provide basic services.

The performance controller 540 may adjust operation parameters of the SoC 505 according to a control request provided from a kernel of the operating system (OS) 533. For example, the performance controller 540 may adjust a level of DVFS to enhance the performance of the SoC 505. Alternatively, the performance controller 540 may control a driving mode such as Big.LITTLE.™ of the multi-core processor 510 according to a request of the kernel.

In this case, the performance controller 540 may include a boost manager 545 that performs a performance boosting by consecutively executing the plurality of boosting policies. The performance controller 540 controls the PMU 530 and the CMU 535 connected to the PMIC 600 such that the PMU 530 and the CMU 535 provide a desired (or, alternatively, a predetermined) driving voltage and a desired (or, alternatively, a predetermined) driving clock to each of power domains, respectively.

The user interface controller 550 controls user input and output from user interface devices. For example, the user interface controller 550 may display a keyboard screen or the like for inputting data to the display 552 according to the control of the multi-core processor 510. Alternatively, the user interface controller 550 may control the display 552 to display data that a user requests. The user interface controller 550 may decode data provided from a user interface device such as a touch panel 554 as input data.

The memory interface 560 accesses the storage device 570 according to a request of the multi-core processor 510. That is, the memory interface 560 provides interfacing between the SoC 505 and the storage device 570. For example, data processed by the multi-core processor 510 is stored in the storage device 570 through the memory interface 560. In other embodiments, data stored in the storage device 570 may be provided to the multi-core processor 510 through the memory interface 560.

The storage device 570 is provided as a storage medium of the mobile device 500. The storage device 570 may store application programs 531, an OS image 573, and various types of data. The storage device 570 may be provided as a memory card (MMC, eMMC, SD, MicroSD, etc.). The storage device 570 may include a NAND-type flash memory having a high-capacity storage capability.

The accelerator 580 may be provided to a separate intellectual property (IP) to enhance processing speed of multimedia or multimedia data. For example, the accelerator 580 may be provided as an intellectual property (IP) to enhance processing performance of text, audio, still images, animation, video, 2-dimensional data or three-dimensional data.

A system interconnector 590 is a system bus to provide an on-chip network in the SoC 505.

The system interconnector 590 may include, for example, a data bus, an address bus, and a control bus. The data bus is a data transfer path. A memory access path to the working memory 530 or the storage device 570 may be mainly provided. The address bus provides an address exchange path between intellectual properties (IPs). The control bus provides a path to transfer a control signal between intellectual properties (IPs).

Figure 15:
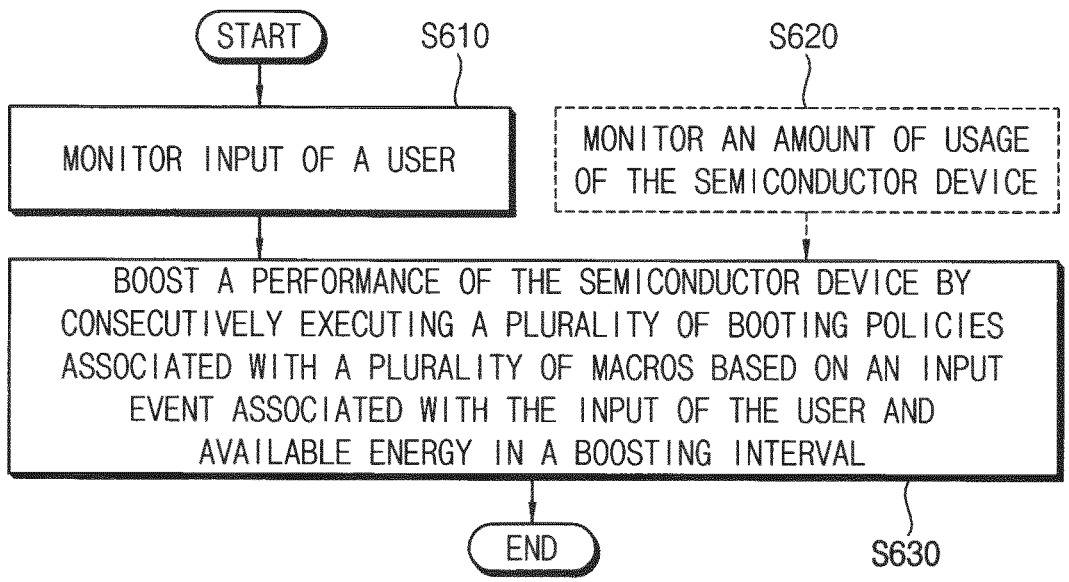
FIG. 15 is a flow chart illustrating a method of controlling performance boosting of a semiconductor device according to example embodiments.

FIG. 15 is a flow chart illustrating a method of controlling performance boosting of a semiconductor device according to example embodiments.

Referring to FIGS. 1 through 15, in a method of controlling performance boosting of a semiconductor device 5 or 7, in operation S610, the boost manager 100, 545 may monitor input of a user. In operation S630, the boost manager 100, 545 performance of the semiconductor device 5 or 7 is boosted by consecutively executing a plurality of boosting policies associated with a plurality of macros based on an input event associated with the input of the user and available energy during a boosting interval.

In example embodiments, each of the plurality of boosting policies is associated with boosting one of an operating frequency of the semiconductor device and an operating voltage of the semiconductor device.

The plurality of boosting policies may include a first boosting policy and a second boosting policy which are sequentially performed. The second boosting policy is performed by adaptively determining a second boosting level to be boosted in the second boosting policy based on a first boosting level boosted in the first boosting policy, a first feedback signal and a first consumed energy. The first feedback signal is obtained based on a result of performing the first boosting policy and is associated with the amount of usage of the semiconductor device and the first consumed energy corresponds to energy consumed in the first boosting policy.

In example embodiments, for controlling performance boosting of a semiconductor device 5 or 7, in operation S620, the boost manager 100, 545 may further monitor an amount of usage of the semiconductor device, and, in operation S630, may determine the boosting level in each of the plurality of boosting policies further based on the amount of usage of the semiconductor device 5 and 7.

Figure 16:
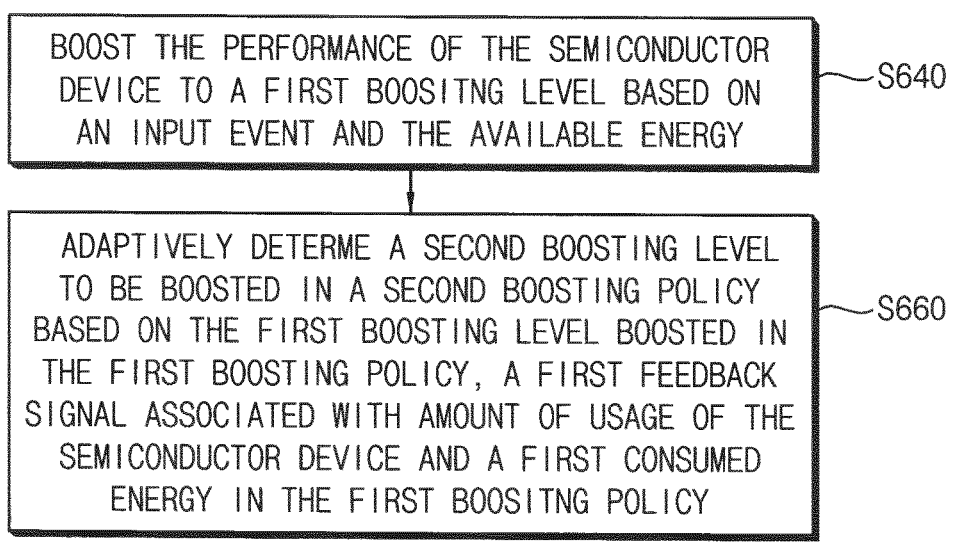
FIG. 16 is a flow chart illustrating an operating of boosting the performance of the semiconductor device in FIG. 15 according to example embodiments.

FIG. 16 is a flow chart illustrating an operating of boosting the performance of the semiconductor device in FIG. 15 according to example embodiments.

Referring to FIGS. 1 through 16, for boosting the performance (S630), in operation S640, the boost manager 100, 545 may boost at least one of an operating frequency and an operating voltage to a first boosting level by executing the first boosting policy based on the input event and the available energy. In operation S660, the boost manager 100 may adaptively determine a second boosting level to be boosted in the second boosting policy based on a first boosting level boosted in the first boosting policy, a first feedback signal and a first consumed energy. The first feedback signal is obtained based on a result of performing the first boosting policy and is associated with the amount of usage of the semiconductor device and the first consumed energy corresponds to energy consumed in the first boosting policy.

For example, the boost manger 100 may increase the second boosting level greater than the first boosting level within the available energy in response to the first feedback signal indicating the amount of usage of the semiconductor device increases.

For example, the boost manager 100 may decrease the second boosting level greater than the first boosting level within the available energy in response to the first feedback signal indicating the amount of usage of the semiconductor device decreases.

Although it is described as the plurality of boosting policies include the first boosting policy and the second boosting policy, the plurality of boosting policies may include first through n-th boosting policies. Boosting level in each of the boosting policies may be adaptively determined based on the boosting level and the amount of usage of the semiconductor device used in the previous boosting policy and the boosting policies are consecutively executed. Accordingly, improved and/or optimal performance boosting can be provided to the semiconductor device 5 or 7, and at the same time, a waste of power can be mitigated and/or prevented.

Figure 17:
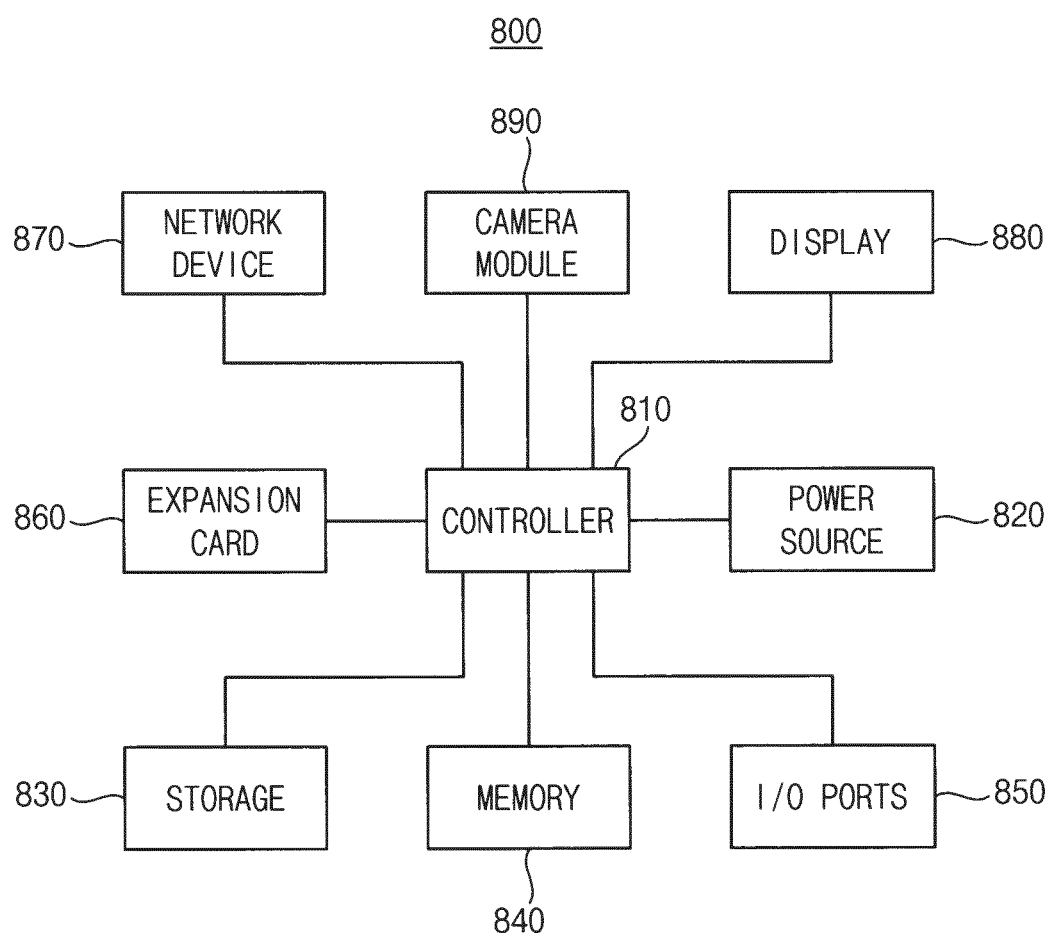
FIG. 17 is a block diagram illustrating an electronic system according to example embodiments.

FIG. 17 is a block diagram illustrating an electronic system according to example embodiments.

Referring to FIG. 17, an electronic system 800 may include a controller 810, a power source 820, a storage 830, a memory 840, input/output (I/O) ports 850, an expansion card 860, a network device 870, and a display 880. According to example embodiments, the electronic system 800 may also include a camera module 890.

The controller 810 may control the operation of each of the elements 820 through 880. The power source 820 may supply an operating voltage to at least one of the elements 810 and 830 through 880. The storage 830 may be implemented as a hard disk drive (HDD) or an SSD.

The memory 840 may be implemented as a volatile or non-volatile memory.

The I/O ports 850 may transmit data to the electronic system or transmit data output from the electronic system to an external device. For example, the I/O ports 850 may include a port for connection with a pointing device such as a computer mouse, a port for connection with a printer, and a port for connection with a universal serial bus (USB) drive.

The expansion card 860 may be implemented as a secure digital (SD) card or an MMC. The expansion card 860 may be a subscriber identity module (SIM) card or a universal SIM (USIM) card.

The network device 870 enables the electronic system to be connected with a wired or wireless network. The display 880 displays data output from the storage 830, the memory 840, the I/O ports 850, the expansion card 860, or the network device 870.

The camera module 890 is a module that can convert an optical image into an electrical image. Accordingly, the electrical image output from the camera module 890 may be stored in the storage 830, the memory 840, or the expansion card 860. In addition, the electrical image output from the camera module 890 may be displayed through the display 880. For example, the camera module 890 may include a camera.

The controller 810 may include a boost manager 100 or may execute a performance boosting function as described above. According to example embodiments, the controller 810 may adaptively adjust the performance boosting based on a user input and the system usage amount. Therefore, improved and/or optimal performance boosting can be provided to the electronic system 800, and at the same time, a waste of power can be mitigated and/or prevented.

In the semiconductor device and a method of controlling performance boosting of a semiconductor device according to example embodiments, boosting level in each of the boosting policies may be adaptively determined based on the boosting level and/or the amount of usage of the semiconductor device used in the previous boosting policy and the boosting policies are consecutively executed. Accordingly, improved and/or optimal performance boosting can be provided to the semiconductor device and at the same time, a waste of power can be mitigated and/or prevented.

The present disclosure may be applied to any electronic devices and systems requiring performance boosting.

For example, the present disclosure may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The elements of the semiconductor device 5 or 7, described above, such as the processor 10 (or, alternatively, HMP core 12), the boost manager 100, power management unit (PMU) 40, clock management unit (CMU) 50, input monitor 60, system usage monitor 70 and timer 80 and the modules therein including the monitoring unit 210 and adaptive boosting unit 214 may be implemented in processing circuitry such as hardware including logic circuits; a hardware/software combination such as a processor executing software; or a combination thereof and memory. For example, the processing circuitry more specifically may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc. The processing circuitry may be special purpose processing circuitry that adaptively determines a boosting level in each of the boosting policies based on the boosting level and/or the amount of usage of the semiconductor device used in the previous boosting policy and the boosting policies are consecutively executed. Accordingly, improved and/or optimal performance boosting can be provided to the semiconductor device and at the same time, a waste of power can be mitigated and/or prevented.

The foregoing is illustrative of example embodiments and is not to be construed as limiting thereof. Although a few example embodiments have been described, those skilled in the art will readily appreciate that many modifications are possible in the example embodiments without materially departing from the present inventive concepts.

What is claimed is:

1. A method of controlling boosting a performance of a semiconductor device, the method comprising:
   monitoring an input of a user; and
   boosting the performance of the semiconductor device for a boosting interval by dividing the boosting interval for the input into a plurality of sub-boosting intervals and consecutively executing a plurality of boosting policies associated with respective ones of a plurality of macros during respective ones of the plurality of sub-boosting intervals within the boosting interval for the input, based on the input of the user and an available energy during the boosting interval to generate a feedback signal utilized in subsequent ones of the plurality of sub-boosting intervals associated with boosting the performance for the input such that,
      during a first sub-boosting interval among the plurality of sub-boosting intervals, a first boosting policy among the plurality of boosting policies is executed to boost the performance to a first boosting level and the feedback signal is generated indicating an amount of usage of the semiconductor device while executing the first boosting policy, and
      during a second sub-boosting interval among the plurality of sub-boosting intervals sequentially after the first sub-boosting interval, a second boosting policy among the plurality of boosting policies is executed to boost the performance to a second boosting level based on the feedback signal obtained during the first sub-boosting interval.

2. The method of claim 1, wherein the plurality of boosting policies are associated with boosting one or more of an operating frequency of the semiconductor device or an operating voltage of the semiconductor device.

3. The method of claim 1, wherein the plurality of macros stores contents associated with corresponding ones of the plurality of boosting policies as a table.

4. The method of claim 3, wherein the plurality of macros describes an available execution time, the available energy and an available application time of the corresponding ones of the plurality of boosting policies.

5. The method of claim 1, further including:
   monitoring an amount of usage of the semiconductor device, and
      wherein the boosting the performance is further based on the amount of usage of the semiconductor device.

6. The method of claim 5, wherein the boosting the performance comprises:
   adaptively determining the second boosting level to be boosted in the second boosting policy based on the first boosting level, the feedback signal and a first consumed energy, the first consumed energy corresponding to energy consumed in the first boosting policy.

7. The method of claim 6, wherein the adaptively determining the second boosting level comprises:
   setting the second boosting level greater than the first boosting level within the available energy, in response to the feedback signal indicating the amount of usage of the semiconductor device increases.

8. The method of claim 6, wherein the adaptively determining the second boosting level comprises:
   setting the second boosting level less than the first boosting level within the available energy in response to the feedback signal indicating the amount of usage of the semiconductor device decreases.

9. The method of claim 1, wherein the boosting the performance of the semiconductor device ends when a termination condition is satisfied, the termination condition associated with one of the available energy, a number of the plurality of boosting policies and an available execution time during which the plurality of boosting policies are executed.

10. The method of claim 9, wherein
   the boosting interval starts at a first time point and ends at a second time point,
   the termination condition is satisfied when any of a first condition, a second condition and a third condition is satisfied,
   the first condition is satisfied if the available energy is consumed before the second time point,
   the second condition is satisfied if a number of the plurality of boosting policies becomes a threshold value, and
   the third condition is satisfied if the available execution time expires.

11. The method of claim 1, further comprising:
   acquiring coordinate information and press/release information related to the input of the user.

12. The method of claim 11, wherein the plurality of boosting policies are associated with boosting one or more of an operating frequency of the semiconductor device or an operating voltage of the semiconductor device, and the method further comprises:
   calculating a speed of the input of the user based on the coordinate information; and
   determining a boosting level of at least one of the operating frequency and the operating voltage based on the speed of the input of the user.

13. The method of claim 1, wherein the boosting comprises:

selectively enabling a plurality of big cores in a heterogeneous multi-processing (HMP) core that includes the plurality of big cores and a plurality of little cores, based on an amount of usage of the semiconductor device.

14. A semiconductor device comprising:

a memory; and processing circuitry configured to control boosting a performance of the semiconductor device by, monitoring input of a user, and boosting the performance of the semiconductor device for a boosting interval by dividing the boosting interval for the input into a plurality of sub-boosting intervals and consecutively executing a plurality of boosting policies associated with respective ones of a plurality of macros during respective ones of the plurality of sub-boosting intervals within the boosting interval for the input, based on an input from the user and available energy during the boosting interval to generate a feedback signal utilized in subsequent ones of the plurality of sub-boosting intervals associated with boosting the performance for the input such that, during a first sub-boosting interval among the plurality of sub-boosting intervals, a first boosting policy among the plurality of boosting policies is executed to boost the performance to a first boosting level and the feedback signal is generated indicating an amount of usage of the semiconductor device while executing the first boosting policy, and during a second sub-boosting interval among the plurality of sub-boosting intervals sequentially after the first sub-boosting interval, a second boosting policy among the plurality of boosting policies is executed to boost the performance to a second boosting level based on the feedback signal obtained during the first sub-boosting interval.

15. The semiconductor device of claim 14, wherein the plurality of boosting policies are associated with boosting one or more of an operating frequency of the semiconductor device or an operating voltage of the semiconductor device.

16. The semiconductor device of claim 14, wherein the memory is configured to store the plurality of macros in a macro list table such that the plurality of macros describe an available execution time, the available energy and an available application time of corresponding ones of the plurality of boosting policies.

17. The semiconductor device of claim 14, wherein the processing circuitry is further configured to, monitor an amount of usage of the semiconductor device, and adaptively determine a boosting level in each of the plurality of boosting policies based on the amount of usage of the semiconductor device.

18. The semiconductor device of claim 17, wherein the processing circuitry is configured to boost the performance by, adaptively determining the second boosting level to be boosted in the second boosting policy based on the first boosting level, the feedback signal and a first consumed energy, the first consumed energy corresponding to energy consumed in the first boosting policy.

19. The semiconductor device of claim 14, wherein the processing circuitry includes a heterogeneous multi-processing (HMP) core that includes a plurality of big cores and a plurality of little cores, the HMP core configured to, determine whether an elapsed time from an input event associated with the input from the user exceeds an available application time of the plurality of boosting policies, and selectively enable the plurality of big cores based on whether the elapsed time exceeds the available application time.

20. A method of controlling boosting a performance of a semiconductor device, the method comprising:

monitoring an input of a user;

monitoring an amount of usage of the semiconductor device; and boosting the performance of the semiconductor device for a boosting interval by dividing the boosting interval for the input into a plurality of sub-boosting intervals and sequentially executing a first boosting policy and a second boosting policy included in plurality of boosting policies associated with respective ones of a plurality of macros based on the input of the user during respective ones of the plurality of sub-boosting intervals within the boosting interval, the amount of usage of the semiconductor device and available energy in the boosting interval to generate a feedback signal utilized in subsequent ones of the plurality of sub-boosting intervals associated with boosting the performance for the input such that, during execution of the second boosting policy, the boosting includes, obtaining the feedback signal based on a result of boosting performance to a first boosting level during a first sub-boosting interval among the plurality of sub-boosting intervals by performing the first boosting policy, the first feedback signal being associated with the amount of usage of the semiconductor device while executing the first boosting policy, and adaptively determining a second boosting level to be boosted during a second sub-boosting interval among the plurality of sub-boosting intervals by performing the second boosting policy based on the first boosting level, the feedback signal and a first consumed energy, the first consumed energy corresponding to energy consumed in the first boosting policy.

* * * * *